United States Patent
Nakashima et al.

(10) Patent No.: US 12,164,005 B2
(45) Date of Patent: Dec. 10, 2024

(54) EXAMINATION METHOD FOR MALFUNCTION DETECTION

(71) Applicant: APB CORPORATION, Tokyo (JP)

(72) Inventors: Yusuke Nakashima, Kyoto (JP); Shinya Kobayashi, Kyoto (JP); Hideaki Horie, Tokyo (JP)

(73) Assignee: APB CORPORATION, Tokyo (JP)

( * ) Notice: Subject to any disclaimer, the term of this patent is extended or adjusted under 35 U.S.C. 154(b) by 73 days.

(21) Appl. No.: 17/776,874

(22) PCT Filed: Nov. 19, 2020

(86) PCT No.: PCT/JP2020/043252
§ 371 (c)(1),
(2) Date: May 13, 2022

(87) PCT Pub. No.: WO2021/100819
PCT Pub. Date: May 27, 2021

(65) Prior Publication Data
US 2023/0358813 A1 Nov. 9, 2023

(30) Foreign Application Priority Data
Nov. 19, 2019 (JP) .................................. 2019-208926
Nov. 19, 2019 (JP) .................................. 2019-208927

(51) Int. Cl.
*G01N 27/04* (2006.01)
*G01R 31/01* (2020.01)
(Continued)

(52) U.S. Cl.
CPC ........... *G01R 31/378* (2019.01); *G01R 31/01* (2013.01); *G01R 31/3865* (2019.01); *G01R 31/389* (2019.01); *H01M 4/668* (2013.01)

(58) Field of Classification Search
None
See application file for complete search history.

(56) References Cited

U.S. PATENT DOCUMENTS

2001/0019270 A1* 9/2001 Onishi ............. H01M 10/4285
324/426
2015/0293043 A1* 10/2015 Kawamuro ............ G01N 27/04
702/65
(Continued)

FOREIGN PATENT DOCUMENTS

JP 2001-236985 8/2001
JP 2005-339925 12/2005
(Continued)

OTHER PUBLICATIONS

International Search Report issued Jan. 19, 2021 in International (PCT) Application No. PCT/JP2020/043252.

*Primary Examiner* — Brandi N Hopkins
*Assistant Examiner* — Nigel H Plumb
(74) *Attorney, Agent, or Firm* — Wenderoth, Lind & Ponack, L.L.P.

(57) ABSTRACT

An examination method includes bringing conductor probes into contact with surfaces of an examination target to measure voltage or electric resistance at points on the surfaces of the examination target, and determining whether or not the voltage or the electric resistance is out of an allowable range at any of the points. The examination target is a resin current collector, an electrode sheet having an active material layer laminated on a resin current collector, a separator-attached electrode sheet in which a separator is combined with an electrode sheet, or a unit cell including one set of a positive electrode resin current collector, a positive electrode active material layer, a separator, a negative electrode active material layer, and a negative electrode resin current collector, which are laminated in order. With the examination method, a defect such as a short circuit can be easily found and production yield can be improved.

5 Claims, 3 Drawing Sheets

(51) Int. Cl.
    *G01R 31/378*     (2019.01)
    *G01R 31/385*     (2019.01)
    *G01R 31/389*     (2019.01)
    *H01M 4/66*     (2006.01)

(56) References Cited

U.S. PATENT DOCUMENTS

2016/0056455 A1*   2/2016   Shibusawa .............. C23C 16/30
                                                            427/122
2016/0072157 A1*   3/2016   Mankyu ................ H01M 10/42
                                                            324/551

FOREIGN PATENT DOCUMENTS

| JP | 2009-48971 | | 3/2009 |
| JP | 2010-157449 | | 7/2010 |
| JP | 2012-83117 | | 4/2012 |
| JP | 2012083117 | * | 4/2012 |
| JP | 2015-191814 | | 11/2015 |
| WO | 2014/147808 | | 9/2014 |

\* cited by examiner

EXAMINATION METHOD FOR MALFUNCTION DETECTION

TECHNICAL FIELD

The present invention relates to an examination method and a manufacturing method for an assembled battery.

BACKGROUND ART

As the demand for large-capacity batteries increases and a large number of assembled batteries in which a plurality of unit cells are stacked are manufactured, there is an increasing need to efficiently remove defective products in the production process of the batteries.

Japanese Unexamined Patent Application, First Publication No. 2001-236985 discloses a short circuit examination method for a battery formed by inserting an electrode plate group that has been constituted by laminating a positive electrode plate and a negative electrode plate, with a separator being sandwiched therebetween, into an electrolytic bath, where the short circuit examination method is characterized by examining a short circuit defect while pressurizing the electrode plate group before inserting the electrode plate group into the electrolytic bath.

Japanese Unexamined Patent Application, First Publication No. 2005-339925 discloses a method of examining unit cells constituting an assembled battery, where the examination method for unit cells is characterized by arranging a plurality of unit cells in a stackwise manner and examining each of the unit cells in a state where a group of the arranged unit cells is pressed in the stacking direction.

SUMMARY OF INVENTION

Technical Problem

However, in the examination method disclosed in Japanese Unexamined Patent Application, First Publication No. 2001-236985, a short circuit defect is examined in a state where the electrode plate group in which the unit cells are assembled is pressed, and thus it is not easy to specify which unit cell has a defect in a case where a defect is found in the electrode plate group. On the other hand, in the examination method disclosed in Japanese Unexamined Patent Application, First Publication No. 2005-339925, each of unit cells is examined in a state where the group of unit cells arranged in a stackwise manner is pressed in the stacking direction, and thus in a case where a defect is found in the group of unit cells, it is necessary to replace the unit cell having the defect from the group of unit cells with another one. As described above, the examination method in the related art cannot be said to be a method of efficiently finding a defect.

An object of the present invention is to provide an examination method capable of easily finding a defect such as short circuit in a resin current collector, an electrode sheet, a separator-attached electrode sheet, or a unit cell unit. In addition, another object of the present invention is to provide a manufacturing method for an assembled battery by using the above examination method.

Solution to Problem

The present invention is an examination method characterized by including a step of bringing conductor probes into contact with surfaces of an examination target to measure voltage or electric resistance at a plurality of points on the surfaces of the examination target, the examination target being a resin current collector, an electrode sheet having an active material layer laminated on the resin current collector, a separator-attached electrode sheet in which a separator is combined with the electrode sheet, or a unit cell including one set of a positive electrode resin current collector, a positive electrode active material layer, a separator, a negative electrode active material layer, and a negative electrode resin current collector, which are laminated in order, and a step of determining whether or not a point at which the voltage or the electric resistance is out of an allowable range is present in the examination target; and a manufacturing method for an assembled battery, characterized by including a step of stacking a plurality of unit cells by using an examination target that has been determined to have no point at which the voltage or the electric resistance is out of the allowable range by the examination method.

Advantageous Effects of Invention

According to the present invention, it is possible to easily find a defect such as short circuit in a resin current collector, an electrode sheet, a separator-attached electrode sheet, or a unit cell unit. As a result, it is possible to manufacture an assembled battery by using a unit cell having no defect, and thus the production yield can be improved.

DESCRIPTION OF EMBODIMENTS

[Examination Method]

The examination method of the present invention includes a step of bringing conductor probes into contact with surfaces of an examination target to measure voltage or electric resistance at a plurality of points on the surface of the examination target, and a step of determining whether or not a point at which the voltage or the electric resistance is out of an allowable range is present in the examination target.

In a case where a short circuit point is present in the examination target, the voltage at the short circuit point becomes 0 V. As a result, in a case where the terminals of the conductor probes are brought into contact with a short circuit point in pinpoint accuracy, the voltage at that point becomes 0 V even in a case where the voltage at the other point is, for example, about 100 my. On the other hand, depending on the size of the terminal of the conductor probe, the voltage in the peripheral region including the short circuit point may be measured. In such a case, the voltage becomes a numerical value obtained by including the non-short circuit point, and thus it does not become 0 V and becomes, for example, about 50 mV. In consideration of such behavior, the examination method of the present invention determines that a short circuit point is present in the examination target in a case where a point at which a measured voltage is out of an allowable range is present in the examination target.

In the examination method of the present invention, the allowable range of the voltage is preferably ±30% of a predetermined value depending on the specification of the electrode. It is noted that the predetermined value can also be determined from the average value of the voltages measured at a plurality of points on the surface of the examination target.

Further, it is desired that the examination target has a uniform resistance distribution in the plane. For this reason, in the examination method of the present invention, in a case where a point at which a measured electric resistance is out of an allowable range is present in an examination target, it is determined that the examination target has a defect. It is noted that the increase in electric resistance is caused by poor dispersion of the conductive material, which leads to deterioration of battery resistance. On the other hand, the decrease in electric resistance is caused by a minute short circuit in which a point to be insulated is conducted to decrease electric resistance, which leads to deterioration of battery quality or deterioration of reliability at abnormal conditions.

In the examination method of the present invention, the allowable range of the electric resistance is preferably ±30% of a predetermined value depending on the specification of the electrode. It is noted that the predetermined value can also be determined from the average value of the electric resistances measured at a plurality of points on the surface of the examination target.

In the examination method of the present invention, the examination target is a unit cell including one set of a positive electrode resin current collector, a positive electrode active material layer, a separator, a negative electrode active material layer, and a negative electrode resin current collector, which are laminated in order. In a unit cell using the metal current collector in the related art, the electric resistance in the lateral direction (the plane direction) is low, and thus the current value is uniform in the plane, whereby the examination method of the present invention cannot find a defect. As described above, it can be said that the examination method of the present invention is effective solely for a unit cell using a resin current collector.

In the examination method of the present invention, examples of the unit cell that is used as an examination target include a lithium ion battery. In the present specification, the lithium ion battery shall include a concept of a lithium ion secondary battery as well.

In the examination method of the present invention, instead of the unit cell, it is possible to use, as the examination target a resin current collector, an electrode sheet having an active material layer laminated on the resin current collector, a separator-attached electrode sheet in which a separator is combined with the electrode sheet. Since a resin current collector is also used in this examination target, it is possible to obtain the same effect as in the case where the unit cell is used as an examination target.

Figure 1:
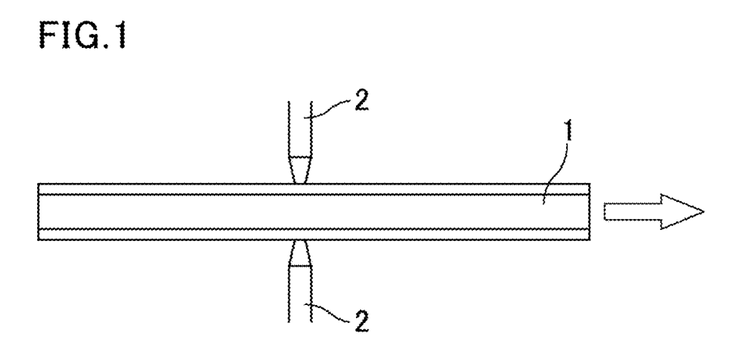
FIG. 1 is a side view schematically illustrating an example of an examination method of the present invention.
Figure 2:
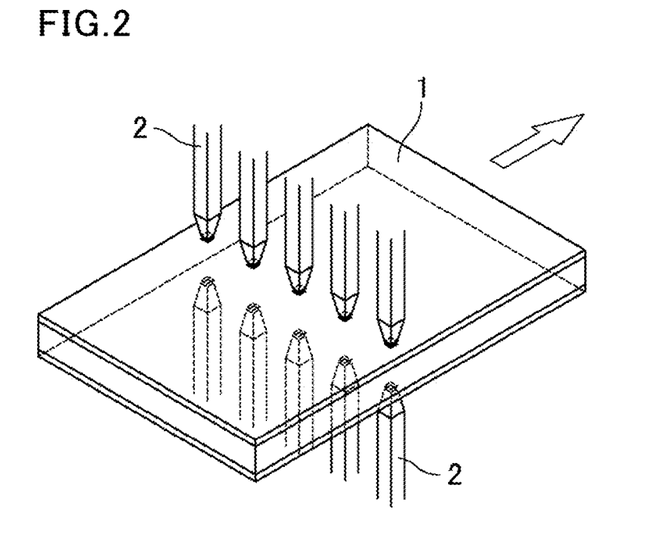
FIG. 2 is a perspective view schematically illustrating another example of the examination method of the present invention.
Figure 3:
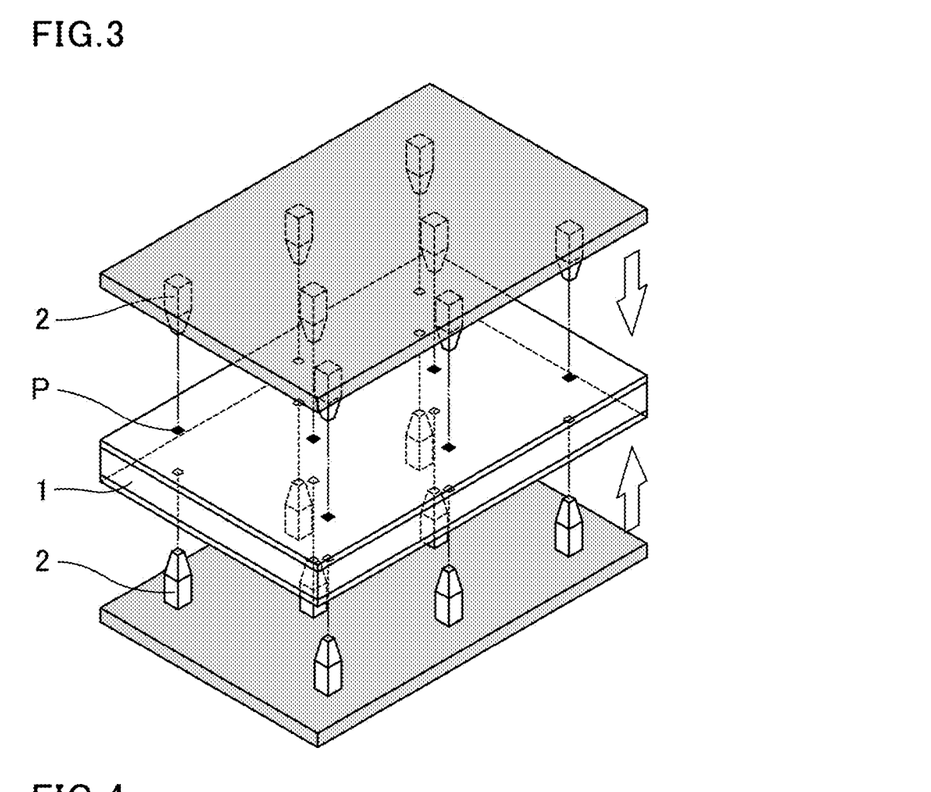
FIG. 3 is a perspective view schematically illustrating still another example of the examination method of the present invention.

In the examination method of the present invention, the method of bringing conductor probes into contact with surfaces of the examination target is not particularly limited. However, from the viewpoint of reliably detecting a defective point in the plane, as illustrated in FIG. 1, FIG. 2, and FIG. 3 described later, it is preferable that the conductor probes are brought into contact with points on the surfaces of the examination target, where the points face each other in the stacking direction.

In the examination method of the present invention, the material of the conductor probe is not particularly limited. However, from the viewpoint of preventing metal contamination (mixing of foreign matter of metals), it is preferable that the conductor probe consists of a carbon material. In a case of measuring electric resistance, not only from the viewpoint of preventing metal contamination (mixing of foreign matter of metals) but also from the viewpoint of increasing the measurement sensitivity, it is preferable that the conductor probe consists of a carbon material, that is, the material of the tip portion (the portion that comes into contact with the examination target) of the conductor probe is a carbon material. The material of the tip portion of the conductor probe may be a metal-based material such as copper or aluminum.

In the examination method of the present invention, the shape and the size of the conductor probe are not particularly limited. Examples of the shape of the tip portion (the portion that comes into contact with the examination target) of the conductor probe include a rectangle and a square. Further, the smaller the area of the tip portion of the conductor probe is, the more local information can be obtained, whereby the sensitivity becomes better. As a result, the area of the tip portion of the conductor probe is preferably 12 $cm^2$ or less.

In the examination method of the present invention, the pressure at the time when the conductor probe is brought into contact is not particularly limited; however, it is preferably 5 kPa or more.

FIG. 1 is a side view schematically illustrating an example of an examination method of the present invention.

In FIG. 1, a pair of conductor probes 2 is disposed on both sides of an examination target 1, and the conductor probes 2 are brought into contact with points on the surfaces of the examination target 1, where the points face each other in the stacking direction (the vertical direction in FIG. 1) of the examination target 1. In this state, the examination target 1 is moved in the arrow direction, whereby it is possible to continuously measure the voltage or electric resistance at a plurality of points on the surface of the examination target 1. It is noted that a plurality of pairs of conductor probes 2 may be disposed on both sides of the examination target along the arrow direction.

FIG. 2 is a perspective view schematically illustrating another example of the examination method of the present invention.

In FIG. 2, a plurality of pairs of conductor probes 2 are disposed on both sides of the examination target 1 along the width direction of the examination target 1, and the conductor probes 2 are brought into contact with points on the surfaces of the examination target 1, where the points face each other in the stacking direction of the examination target 1. In this state, the examination target 1 is moved in the arrow direction, whereby it is possible to measure at the same time the voltage or electric resistance of the examination target 1 in the width direction. The plurality of pairs of conductor probes 2 may be disposed in a so-called zigzag shape. A plurality of pairs of conductor probes 2 may be further disposed on both sides of the examination target along the arrow direction.

In the examination method of the present invention, as illustrated in FIG. 1 and FIG. 2, it is preferable that the conductor probes are brought into contact with the surfaces of the examination target by causing the examination target to pass through a region in which the conductor probes are disposed in a state of facing each other in the stacking direction. In the examination method of the present invention, the conductor probe may be moved instead of moving the examination target. In addition, both the examination target and the conductor probe may be moved.

FIG. 3 is a perspective view schematically illustrating still another example of the examination method of the present invention.

In FIG. 3, a plurality of pairs of conductor probes 2 are disposed at points matching with measurement points P of the examination target 1, on both sides of the examination target 1, and the conductor probes 2 are brought into contact with points on the surfaces of the examination target 1, where the points face each other in the stacking direction of the examination target 1. This makes it possible to measure at the same time the voltage or electric resistance at a plurality of points on the surface of the examination target 1. The disposition of the conductor probes 2 is not particularly limited, and it is disposed, for example, in a staggered form, a lattice form, or the like.

In the examination method of the present invention, in a case where a plurality of conductor probes are brought into contact with the surfaces of the examination target, the disposition of the conductor probes is not particularly limited. Further, the distance between the adjacent conductor probes is preferably evenly spaced; however, it is not particularly limited.

Hereinafter, Examples of the examination method of the present invention will be described. It is noted that the examination method of the present invention is not limited to these Examples.

Example 1-1

As conductor probes, measuring terminals having a tip portion area of 12 cm$^2$ are brought into contact with both sides (an upper surface and a lower surface) of a unit cell. At this time, the terminals are pressed so that a pressure of 0.066 kgf/cm$^2$ (6.5 kPa) is applied. In addition, the tips of the measuring terminals are connected to a digital multimeter (manufactured by HIOKI E. E. CORPORATION, DT4255) to monitor the voltage of the unit cell. In that state, the end of the unit cell is grasped with a clip, and the unit cell is pulled as illustrated in FIG. 1 to cause the unit cell to pass between the measuring terminals. The moving speed is set to be 10 to 60 mm/sec. As a result of the measurement, in the specification of Example 1-1, it was confirmed that 140 mV is exhibited in the normal region and that in a case of causing to pass through the intentionally short circuited point, an event in which the voltage value decreases to 50 mV occurs. That is, the difference (ΔmV) between the voltage in the normal region and the voltage at the short circuit point was 90 mV.

Examples 1-2 to 1-8

The voltage of the unit cell was monitored in the same manner as in Example 1-1, except that the area of the tip portion of the measuring terminal, where the tip portion comes into contact with the upper surface of the unit cell (described as "Upper surface probe area" in Table 1), the area of the tip portion of the measuring terminal, where the tip portion comes into contact with the lower surface of the unit cell (described as "Lower surface probe area" in Table 1), and the pressure applied when the measuring terminals are brought into contact (described as "Pressing" in Table 1) were changed to the values shown in Table 1.

Table 1 shows the difference (Amy) between the voltage in the normal region and the voltage at the short circuit point in Examples 1-1 to 1-8. It is noted that the larger this numerical value is, the better the sensitivity is.

TABLE 1

| Example | Area of upper surface probe [cm$^2$] | Area of lower surface probe [cm$^2$] | Pressing [kPa] | Difference between voltage in normal region and voltage at short circuit point [mV] |
|---|---|---|---|---|
| 1-1 | 12 | 12 | 6.5 | 90 |
| 1-2 | 48 | 48 | 5 | 43 |
| 1-3 | 24 | 24 | 5 | 92 |
| 1-4 | 12 | 12 | 5 | 112 |
| 1-5 | 24 | 24 | 8.2 | 93 |
| 1-6 | 24 | 24 | 2.6 | 42 |
| 1-7 | 12 | 48 | 5 | 100 |
| 1-8 | 24 | 48 | 5 | 87 |

Example 2-1

As the conductor probes, measuring terminals, in which the material (described as "Contact surface material kind" in Table 2) of the tip portion constituting the surface of contact with the examination target is a carbon material and the area of the tip portion is 48 cm$^2$, are brought into contact with both sides (the upper surface and the lower surface) of the unit cell. At this time, the terminals are pressed so that a pressure of 5 kPa is applied. In addition, the tips of the measuring terminals are connected to an LCR meter (LCR-916 manufactured by TEXIO TECHNOLOGY CORPORATION) to monitor the electric resistance of the unit cell. In that state, the end of the unit cell is grasped with a clip, and the unit cell is pulled as illustrated in FIG. 1 to cause the unit cell to pass between the measuring terminals. The moving speed is set to be 10 to 60 mm/sec. As a result of the measurement, in the specification of Example 2-1, it was confirmed that the average resistance value is 51.0 Ω·cm$^2$ in the normal region and that in a case of causing to pass through the intentionally short circuited point, an event in which the resistance value drops to 46.0 Ω·cm$^2$ occurs.

Example 2-2 to Example 2-7

The electric resistance of the unit cell was monitored in the same manner as in Example 2-1, except that the area of the tip portion of the measuring terminal, where the tip portion comes into contact with the upper surface of the unit cell (described as "Upper surface probe area" in Table 2), the area of the tip portion of the measuring terminal, where the tip portion comes into contact with the lower surface of the unit cell (described as "Lower surface probe area" in Table 2), and the pressure applied when the measuring terminals are brought into contact (described as "Pressing" in Table 2) were changed to the values shown in Table 2.

Table 2 shows the average resistance value of the normal region, the resistance value of the short circuit point, the upper surface probe area, the lower surface probe area, pressing, and the contact surface material kind in Examples 2-1 to 2-7.

TABLE 2

| Example | Average value of resistance in normal region [Ω·cm²] | Resistance value of short circuit point [Ω·cm²] | Area of upper surface probe [cm²] | Area of lower surface probe [cm²] | Pressing [kPa] | Contact surface material kind |
|---|---|---|---|---|---|---|
| 2-1 | 51.0 | 46.0 | 48 | 48 | 5 | Carbon material |
| 2-2 | 48.0 | 37.9 | 24 | 24 | 5 | Carbon material |
| 2-3 | 57.0 | 44.5 | 12 | 12 | 5 | Carbon material |
| 2-4 | 45.0 | 34.8 | 24 | 24 | 8.2 | Carbon material |
| 2-5 | 48.0 | 43.3 | 24 | 24 | 2.6 | Carbon material |
| 2-6 | 49.0 | 37.8 | 12 | 48 | 5 | Carbon material |
| 2-7 | 53.0 | 43.3 | 24 | 48 | 5 | Carbon material |

From Table 2, it was confirmed that in Examples 2-1 to 2-7, in a case where the measuring terminals pass through the intentionally short circuited point, the resistance value decreases as compared with a case of the normal region.

Example 2-8

The electric resistance of the unit cell was monitored under the conditions of Example 2-2.

Example 2-9

The electric resistance of the unit cell was monitored in the same manner as in Example 2-8, except that the material (described as "Contact surface material kind" in Table 3) of the tip portion constituting the surface of contact with the examination target was changed from the carbon material to copper, which is a metal-based material.

Example 2-10

The electric resistance of the unit cell was monitored in the same manner as in Example 2-8, except that the material of the tip portion constituting the surface of contact with the examination target was changed from the carbon material to aluminum, which is a metal-based material.

In Examples 2-8 to 2-10, the normal region of the unit cell was measured at a plurality of points, the standard deviation (N) of the resistance value was calculated, and the difference (S) between the resistance value in the normal region and the resistance value in the short circuit region was calculated, whereby the S/N ratio, which is the ratio of S to N, was calculated. It is noted that the smaller this value is, the higher the measurement sensitivity is.

Table 3 shows the S/N ratio, the upper surface probe area, the lower surface probe area, the pressing, and the contact surface material kind in Examples 2-8 to 2-10.

TABLE 3

| Example | S/N ratio | Area of upper surface probe [cm²] | Area of lower surface probe [cm²] | Pressing [kPa] | Contact surface material kind |
|---|---|---|---|---|---|
| 2-8 | 100% | 24 | 24 | 5 | Carbon material |
| 2-9 | 9% | 24 | 24 | 5 | Metal-based material (Copper) |
| 2-10 | 11% | 24 | 24 | 5 | Metal-based material (Aluminum) |

From Table 3, it is shown that in a case where the carbon material is used, the S/N ratio is high and thus the measurement sensitivity is high as compared with a case where the material of the tip portion constituting the surface of contact with the examination target is a metal-based material (copper or aluminum). This is presumed to be because the carbon material has a small contact resistance and a small standard deviation N, whereas the metal-based material has a large contact resistance and a large standard deviation N, whereby the difference in contact resistance between the surface of the unit cell and the conductor probe is reduced in the case of the carbon material.

Example 2-11 to Example 2-20

The electric resistance of ten unit cells was monitored under the conditions of Example 2-2, and the standard deviation N of the resistance values in each unit cell was calculated. Further, in each Example, the output/design ratio, which is the ratio of the output obtained by the actual output test of the unit cell to the output calculated from the design of the unit cell, was calculated. The closer this value is to 100%, the closer to the output as designed is, and thus it can be determined as a good product.

Table 4 shows the standard deviation of the resistance values and the output/design ratio in Examples 2-11 to 2-20.

TABLE 4

| Example | Standard deviation of resistance value [Ω·cm²] | Output/design ratio |
|---|---|---|
| 2-11 | 3.1 | 100% |
| 2-12 | 3.2 | 100% |
| 2-13 | 5.8 | 98% |
| 2-14 | 5.7 | 98% |
| 2-15 | 8.1 | 97% |
| 2-16 | 7.8 | 97% |
| 2-17 | 8.9 | 96% |
| 2-18 | 14.3 | 95% |
| 2-19 | 16.1 | 93% |
| 2-20 | 23.8 | 90% |

Table 4 shows that there is a correlation between the standard deviation N of the resistance values obtained by the examination method of the present invention and the output/design ratio. Specifically, the larger the standard deviation N of the resistance values, the lower the output/design ratio. From these results, it was confirmed that it is possible to determine whether or not the unit cell is a good product by the examination method of the present invention without actually carrying out the output test of the unit cell.

Figure 4:
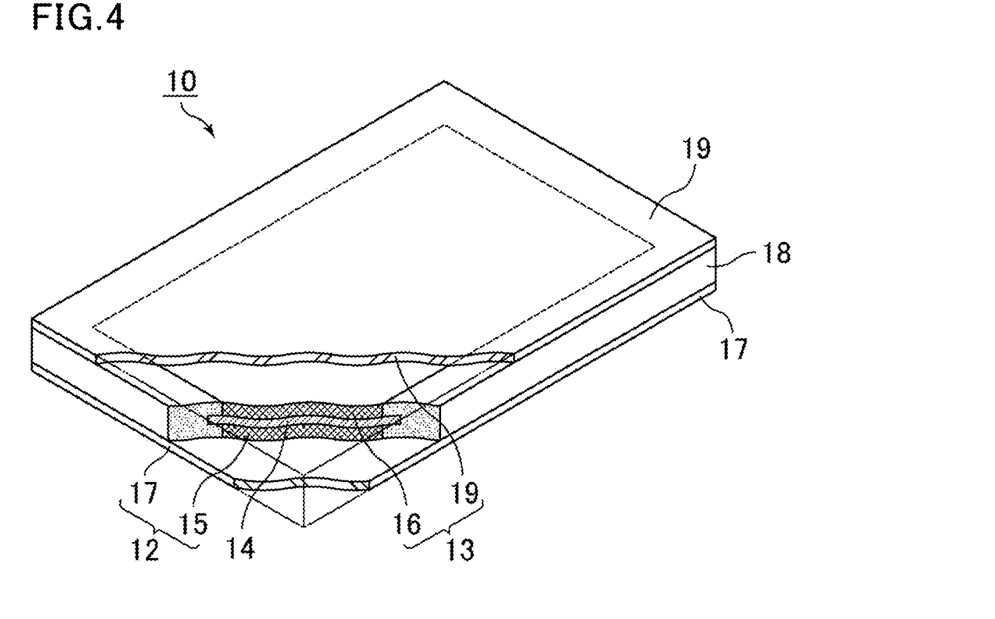
FIG. 4 is a partially cutaway perspective view schematically illustrating an example of a unit cell that is used as an examination target in the examination method of the present invention.

FIG. 4 is a partially cutaway perspective view schematically illustrating an example of a unit cell that is used as an examination target in the examination method of the present invention.

The unit cell 10 illustrated in FIG. 4 is constituted by laminating a positive electrode 12 having a positive electrode active material layer 15 formed on the surface of a positive electrode resin current collector 17 having a substantially rectangular flat plate shape, and a negative electrode 13 having a negative electrode active material layer 16 formed on the surface of a negative electrode resin current collector 19 having a similarly substantially flat plate shape, with a separator 14 having a similarly substantially flat plate shape being sandwiched therebetween, and is formed in a substantially rectangular flat plate shape as a whole. The positive electrode 12 and the negative electrode 13 function as the positive electrode and the negative electrode of the lithium ion battery.

The unit cell 10 preferably has a ring-shaped frame member 18 that is disposed between the positive electrode resin current collector 17 and the negative electrode resin current collector 19 to fix the peripheral edge part of the separator 14 between the positive electrode resin current collector 17 and the negative electrode resin current collector 19, and seals the positive electrode active material layer 15, the separator 14, and the negative electrode active material layer 16.

The positive electrode resin current collector 17 and the negative electrode resin current collector 19 are positioned such that they are opposed to each other with a predetermined spacing by the frame member 18, and the positive electrode active material layer 15 and the negative electrode active material layer 16 are also positioned such that they are opposed to each other with the separator 14 being sandwiched therebetween, with a predetermined spacing by the frame member 18.

The spacing between the positive electrode resin current collector 17 and the separator 14 and the spacing between the negative electrode resin current collector 19 and the separator 14 are adjusted in response to the capacity of the lithium ion battery, and the positional relationship between the positive electrode resin current collector 17, the negative electrode resin current collector 19, and the separator 14 is determined so that the required spacing can be obtained.

Instead of the unit cell 10, the examination target that is used in the examination method of the present invention may be, the positive electrode resin current collector 17, the negative electrode resin current collector 19, a positive electrode sheet having the positive electrode active material layer 15 laminated on the positive electrode resin current collector 17, a negative electrode sheet having the negative electrode active material layer 16 laminated on the negative electrode resin current collector 19, a separator-attached positive electrode sheet in which the separator 14 is combined with the positive electrode sheet, or a separator-attached negative electrode sheet in which the separator 14 is combined with the negative electrode sheet.

Hereinafter, a preferred aspect of each component constituting the unit cell will be described.

The positive electrode active material layer contains a positive electrode active material.

Examples of the positive electrode active material include a composite oxide of lithium and a transition metal {a composite oxide having one kind of transition metal element ($LiCoO_2$, $LiNiO_2$, $LiAlMnO_4$, $LiMnO_2$, $LiMn_2O_4$, or the like), a composite oxide having two kinds of transition metal elements (for example, $LiFeMnO_4$, $LiNi_{1-x}Co_xO_2$, $LiMn_{1-y}Co_yO_2$, $LiNi_{1/3}Co_{1/3}Al_{1/3}O_2$, and $LiNi_{0.8}Co_{0.15}Al_{0.05}O_2$), a composite oxide having three or more kinds of transition metal elements [for example, $LiM_aM'_bM''_cO_2$ (where M, M', and M'' are transition metal elements different each other and satisfy a+b+c=1, and one example is $LiNi_{1/3}Mn_{1/3}Co_{1/3}O_2$)], or the like}, a lithium-containing transition metal phosphate (for example, $LiFePO_4$, $LiCoPO_4$, $LiMnPO_4$, or $LiNiPO_4$), a transition metal oxide (for example, $MnO_2$ and $V_2O_5$), a transition metal sulfide (for example, $MoS_2$ or $TiS_2$), and a conductive macromolecule (for example, polyaniline, polypyrrole, polythiophene, polyacetylene, poly-p-phenylene, or polyvinyl carbazole). Two or more thereof may be used in combination.

Here, the lithium-containing transition metal phosphate may be one in which a part of transition metal sites is substituted with another transition metal.

The positive electrode active material is preferably a coated positive electrode active material coated with a conductive auxiliary agent and a coating resin.

In a case where the periphery of the positive electrode active material is coated with a coating resin, the volume change of the electrode is alleviated, and thus the expansion of the electrode can be suppressed.

Examples of the conductive auxiliary agent include a metal-based conductive auxiliary agent [aluminum, stainless steel (SUS), silver, gold, copper, titanium, or the like], a carbon-based conductive auxiliary agent [graphite, or carbon black (acetylene black, Ketjen black, furnace black, channel black, thermal lamp black, or the like), or the like], and a mixture thereof.

One kind of these conductive auxiliary agents may be used alone, or two or more kinds thereof may be used in combination. In addition, an alloy or metal oxide thereof may be used.

Among them, aluminum, stainless steel, silver, gold, copper, titanium, a carbon-based conductive auxiliary agent, or a mixture thereof is more preferable, silver, gold, aluminum, stainless steel, or a carbon-based conductive auxiliary agent is still more preferable, and a carbon-based conductive auxiliary agent is particularly preferable, from the viewpoint of electrical stability.

Further, these conductive auxiliary agents may be those obtained by coating a conductive material (preferably, a metallic conductive material among the conductive auxiliary agents described above) around a particle-based ceramic material or a resin material with plating or the like.

The shape (the form) of the conductive auxiliary agent is not limited to the particle form, may be a form other than the particle form, and may be a form practically applied as a so-called filler-based conductive auxiliary agent such as carbon nanofibers and carbon nanotubes.

The ratio of the coating resin to the conductive auxiliary agent is not particularly limited; however, from the viewpoints of the internal resistance of the battery and the like, the ratio (the coating resin (in terms of resin solid content weight):the conductive auxiliary agent) is preferably 1:0.01 to 1:50, and more preferably 1:0.2 to 1:3.0 in terms of weight ratio.

As the coating resin, those described as the non-aqueous secondary battery active material coating resin in Japanese Unexamined Patent Application, First Publication No. 2017-054703 can be suitably used.

Further, the positive electrode active material layer may contain another conductive auxiliary agent in addition to the conductive auxiliary agent contained in the coated positive electrode active material.

As the conductive auxiliary agent, the same one as the above-described conductive auxiliary agent contained in the coated positive electrode active material can be suitably used.

The positive electrode active material layer contains a positive electrode active material, and it is preferably a non-bound body that does not contain a binding material that binds positive electrode active materials to each other.

Here, the non-bound body means that the position of the positive electrode active material is not fixed by a binding material (also referred to as a binder), and the positive electrode active materials, as well as the positive electrode active material and the current collector are not irreversibly fixed to each other.

The positive electrode active material layer may contain a pressure-sensitive adhesive resin.

As the pressure-sensitive adhesive resin, it is possible to suitably use, for example, a resin obtained by mixing the non-aqueous secondary battery active material coating resin, described in Japanese Unexamined Patent Application, First Publication No. 2017-054703, with a small amount of an organic solvent and adjusting the glass transition temperature thereof to room temperature or lower, and those described as pressure-sensitive adhesives in Japanese Unexamined Patent Application, First Publication No. H10-255805.

Here, the pressure-sensitive adhesive resin means a resin having pressure-sensitive adhesiveness (an adhering property obtained by applying a slight pressure without using water, solvent, heat, or the like) without solidifying even in a case where a solvent component is volatilized and dried. On the other hand, a solution-drying type electrode binder, which is used as a binding material, means a binder that dries and solidifies in a case where a solvent component is volatilized, thereby firmly adhering and fixing active materials to each other.

As a result, the solution-drying type electrode binder (the binding material) and the pressure-sensitive adhesive resin are different materials.

The thickness of the positive electrode active material layer is not particularly limited; however, it is preferably 150 to 600 μm and more preferably 200 to 450 μm from the viewpoint of battery performance.

The negative electrode active material layer contains a negative electrode active material.

As the negative electrode active material, a known negative electrode active material for a lithium ion battery can be used. Examples thereof include a carbon-based material [graphite, non-graphitizable carbon, amorphous carbon, a resin sintered product (for example, a sintered product obtained by sintering and carbonizing a phenol resin, a furan resin, or the like), cokes (for example, a pitch coke, a needle coke, and a petroleum coke), a carbon fiber, or the like], a silicon-based material [silicon, silicon oxide ($SiO_x$), a silicon-carbon composite body (a composite body obtained by coating surfaces of carbon particles with silicon and/or silicon carbide, a composite body obtained by coating surfaces of silicon particles or silicon oxide particles with carbon and/or silicon carbide, silicon carbide, or the like), a silicon alloy (a silicon-aluminum alloy, a silicon-lithium alloy, a silicon-nickel alloy, a silicon-iron alloy, a silicon-titanium alloy, a silicon-manganese alloy, a silicon-copper alloy, a silicon-tin alloy, or the like), or the like], a conductive macromolecule (for example, polyacetylene or polypyrrole), a metal (tin, aluminum, zirconium, titanium, or the like), a metal oxide (a titanium oxide, a lithium-titanium oxide, or the like), a metal alloy (for example, a lithium-tin alloy, a lithium-aluminum alloy, or a lithium-aluminum-manganese alloy), or the like, and a mixture of the above and a carbon-based material.

Further, the negative electrode active material may be a coated negative electrode active material coated with the same conductive auxiliary agent and coating resin as those of the above-described coated positive electrode active material.

As the conductive auxiliary agent and the coating resin, the same conductive auxiliary agent and coating resin as those of the above-described coated positive electrode active material can be suitably used.

Further, the negative electrode active material layer may contain another conductive auxiliary agent in addition to the conductive auxiliary agent contained in the coated negative electrode active material. As the conductive auxiliary agent, the same one as the above-described conductive auxiliary agent contained in the coated positive electrode active material can be suitably used.

Like the positive electrode active material layer, the negative electrode active material layer is preferably a non-bound body that does not contain a binding material that binds negative electrode active materials to each other. In addition, as in the case of the positive electrode active material layer, a pressure-sensitive adhesive resin may be contained.

The thickness of the negative electrode active material layer is not particularly limited; however, it is preferably 150 to 600 μm and more preferably 200 to 450 μm from the viewpoint of battery performance.

The positive electrode resin current collector and the negative electrode resin current collector are resin current collectors consisting of a conductive macromolecule material.

The shape of the resin current collector is not particularly limited, and the current collector may be a sheet-shaped current collector consisting of a conductive macromolecule material or a deposited layer consisting of fine particles consisting of a conductive macromolecule material.

The thickness of the resin current collector is not particularly limited; however, it is preferably 50 to 500 μm.

As the conductive macromolecule material constituting the resin current collector, it is possible to use, for example, a conductive macromolecule or a material obtained by adding a conducting agent to a resin, as necessary.

As the conducting agent constituting the conductive macromolecule material, the same one as the above-described conductive auxiliary agent contained in the coated positive electrode active material can be suitably used.

Examples of the resin constituting the conductive macromolecule material include polyethylene (PE), polypropylene (PP), polymethylpentene (PMP), polycycloolefin (PCO), polyethylene terephthalate (PET), polyether nitrile (PEN), polytetrafluoroethylene (PTFE), styrene butadiene rubber (SBR), polyacrylonitrile (PAN), polymethylacrylate (PMA), polymethylmethacrylate (PMMA), polyvinylidene fluoride (PVdF), an epoxy resin, a silicone resin, and a mixture thereof.

From the viewpoint of electrical stability, polyethylene (PE), polypropylene (PP), polymethylpentene (PMP), or polycycloolefin (PCO) is preferable, and polyethylene (PE), polypropylene (PP), or polymethylpentene (PMP) is more preferable.

Examples of the separator include known separators for a lithium ion battery, such as a porous film consisting of polyethylene or polypropylene, a lamination film of a porous polyethylene film and a porous polypropylene film, a non-woven fabric consisting of a synthetic fiber (a polyester fiber, an aramid fiber, or the like), a glass fiber, or the like and those above of which the surface is attached with ceramic fine particles such as silica, alumina, or titania.

The positive electrode active material layer and the negative electrode active material layer contain an electrolytic solution.

As the electrolytic solution, a known electrolytic solution containing an electrolyte and a non-aqueous solvent, which is used in the manufacturing of the known lithium ion battery, can be used.

As the electrolyte, an electrolyte that is used in a known electrolytic solution can be used. Examples thereof include lithium salts of inorganic acids, such as $LiN(FSO_2)_2$, $LiPF_6$, $LiBF_4$, $LiSbF_6$, $LiAsF_6$, and $LiClO_4$; and lithium salts of organic acids, such as $LiN(CF_3SO_2)_2$, $LiN(C_2F_5SO_2)_2$, and $LiC(CF_3SO_2)_3$. Among these, an imide-based electrolyte [$LiN(FSO_2)_2$, $LiN(CF_3SO_2)_2$, $LiN(C_2F_5SO_2)_2$, or the like] or $LiPF_6$ is preferable from the viewpoints of battery output and charging and discharging cycle characteristics.

As the non-aqueous solvent, a non-aqueous solvent that is used in the known electrolytic solution can be used, and for example, a lactone compound, a cyclic or chain-like carbonic acid ester, a chain-like carboxylic acid ester, a cyclic or chain-like ether, a phosphoric acid ester, a nitrile compound, an amide compound, a sulfone, or a sulfolane, or a mixture thereof can be used.

The electrolyte concentration of the electrolytic solution is preferably 1 to 5 mol/L, more preferably 1.5 to 4 mol/L, and still more preferably 2 to 3 mol/L.

In a case where the electrolyte concentration of the electrolytic solution is less than 1 mol/L, sufficient input/output characteristics of the battery may not be obtained, and in a case where it is more than 5 mol/L, the electrolyte may precipitate.

The electrolyte concentration of the electrolytic solution can be checked by extracting the electrode for a lithium ion battery or the electrolytic solution constituting a lithium ion battery without using a solvent or the like and measuring the concentration thereof.

[Manufacturing Method for Assembled Battery]

The manufacturing method for an assembled battery of the present invention includes a step of stacking a plurality of unit cells by using an examination target that has been determined to have no point at which the voltage or the electric resistance is out of the allowable range by the examination method of the present invention.

Figure 5:
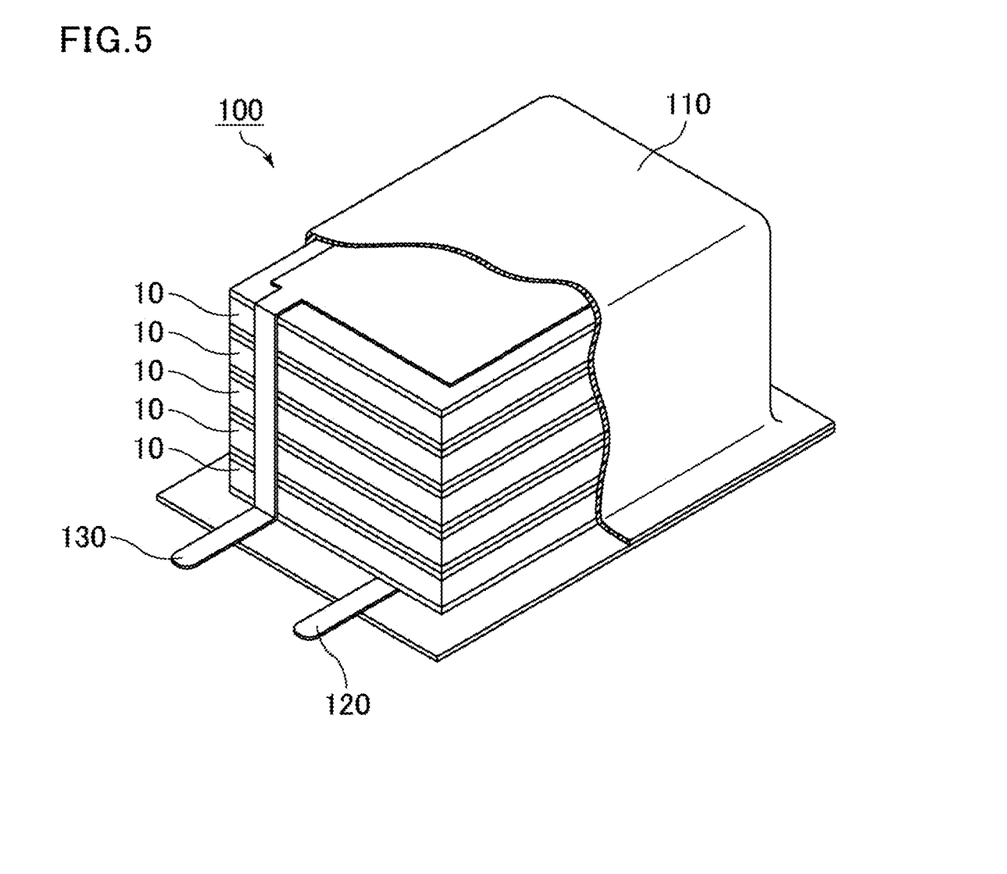
FIG. 5 is a partially cutaway perspective view schematically illustrating an example of an assembled battery.

FIG. 5 is a partially cutaway perspective view schematically illustrating an example of an assembled battery. In FIG. 5, a part of the exterior body is removed for illustration.

An assembled battery 100 illustrated in FIG. 5 is formed by connecting a plurality of the unit cells 10. FIG. 5 is the view illustrating the assembled battery 100 in which five unit cells 10 illustrated in FIG. 4 are stacked. In the assembled battery 100, the upper surface of the negative electrode resin current collector 19 and the lower surface of the positive electrode resin current collector 17 of the adjacent unit cells 10 are laminated to be adjacent to each other. In this case, a plurality of the unit cell 10 are connected in series.

The assembled battery 100 is accommodated in an exterior body 110. As the exterior body 110, a metal can case, a macromolecule metal composite film, or the like can be used.

A conductive sheet is provided on the positive electrode resin current collector 17 on the lowermost surface of the assembled battery 100, and a part of the conductive sheet is led out from the exterior body 110 to serve as a positive electrode lead-out terminal 120. Further, a conductive sheet is provided on the negative electrode resin current collector 19 on the uppermost surface of the assembled battery 100, and a part of the conductive sheet is led out from the exterior body 110 to serve as a negative electrode lead-out terminal 130. The conductive sheet constituting the positive electrode lead-out terminal 120 and the negative electrode lead-out terminal 130 is not particularly limited as long as it is a material having conductivity, and a metal material such as copper, aluminum, titanium, stainless steel, nickel, or an alloy thereof, or a material such as sintered carbon, a conductive macromolecule material, or conductive glass can be appropriately selected and used.

As described above, in the examination method of the present invention, a defect such as short circuit can be found in the resin current collector, the electrode sheet, the separator-attached electrode sheet, or the unit cell unit. For example, in a case of measuring a voltage, it is possible to find a minute short circuit of about several mm. As a result, in the manufacturing method for an assembled battery of the present invention, it is possible to manufacture an assembled battery by using a unit cell definitely having no defect, and thus the production yield can be improved.

INDUSTRIAL APPLICABILITY

The unit cell that is used in the examination method of the present invention is particularly useful as a lithium ion battery that is used for a mobile phone, a personal computer, a hybrid vehicle, or an electric vehicle.

REFERENCE SIGNS LIST

1: examination target
2: conductor probe
10: unit cell
12: positive electrode
13: negative electrode
14: separator
15: positive electrode active material layer
16: negative electrode active material layer
17: positive electrode resin current collector
18: frame member
19: negative electrode resin current collector
100: assembled battery
110: exterior body
120: positive electrode lead-out terminal
130: negative electrode lead-out terminal
P: measurement point

The invention claimed is:

1. An examination method comprising:
bringing conductor probes into physical contact with surfaces of an examination target to measure voltage or electric resistance at points on the surfaces of the examination target; and
determining whether or not the voltage or the electric resistance is out of an allowable range at any of the points,
wherein the examination target is a resin current collector, an electrode sheet having an active material layer laminated on the resin current collector, a separator-attached electrode sheet in which a separator is combined with the electrode sheet, or a unit cell including one set of a positive electrode resin current collector, a positive electrode active material layer, a separator, a negative electrode active material layer, and a negative electrode resin current collector, which are laminated in order.

2. The examination method according to claim 1, wherein the points face each other in a stacking direction.

3. The examination method according to claim 1, wherein the conductor probes are brought into physical contact with the surfaces of the examination target by causing the examination target to pass through a region in which the conductor probes face each other in a stacking direction.

4. The examination method according to claim 1, wherein the conductor probes consist of a carbon material.

5. A manufacturing method for a battery, the manufacturing method comprising stacking a plurality of unit cells using an examination target that has been determined to have no point at which the voltage or the electric resistance is out of the allowable range by the examination method according to claim 1.

* * * * *